United States Patent [19]

Fries et al.

[11] 3,792,318

[45] Feb. 12, 1974

[54] COOLING APPARATUS FOR FLAT SEMICONDUCTORS USING ONE OR MORE HEAT PIPES

[75] Inventors: Paul Fries, Erlangen; Konrad Moritz, Munich, both of Germany

[73] Assignee: Siemens Aktiengesellschaft, Munich, Germany

[22] Filed: Jan. 30, 1973

[21] Appl. No.: 328,028

[30] Foreign Application Priority Data

Feb. 1, 1972 Germany.......................... 2204589

[52] U.S. Cl...... 317/234 R, 317/234 A, 317/234 B, 165/80, 165/105

[51] Int. Cl............................. H01l 3/00, H01l 5/00

[58] Field of Search............... 317/234, 1, 1.5, 4, 6; 165/105, 80

[56] References Cited

UNITED STATES PATENTS

| | | | |
|---|---|---|---|
| 3,143;592 | 8/1964 | August | 317/234 |
| 3,643,131 | 2/1972 | Scherbaum | 317/234 A |
| 3,651,865 | 3/1972 | Feldmanis | 317/234 B |
| 3,668,506 | 6/1972 | Beasley et al. | 317/234 B |
| 3,739,234 | 6/1973 | Bylund et al. | 317/234 R |
| 3,739,235 | 6/1973 | Kessler | 317/234 R |

OTHER PUBLICATIONS

The Heat Pipe by Thomas Feldman, Mechanical Engineering, Feb. 1967 Pages 30–33

Operating Values of Heat Pipes, Electronics Feb. 1970, Page 99

*Primary Examiner*—Andrew J. James

*Attorney, Agent, or Firm*—Kenyon & Kenyon Reilly Carr & Chapin

[57] ABSTRACT

An improved cooling apparatus for flat semiconductors in which the semiconductor is held between two base members each having one or more heat pipes inserted in holes formed therein. Heat is conducted by the vaporized working fluid in the heat pipe from the end inserted into the base member to other end which contains cooling fins which condense the vapor, which in liquid form then returns by capillary action through a wick.

Also shown is an embodiment which permits locating the cooling fins remote from the semiconductor to take advantage of more favorable cooling conditions.

10 Claims, 3 Drawing Figures

Fig. 3

COOLING APPARATUS FOR FLAT SEMICONDUCTORS USING ONE OR MORE HEAT PIPES

BACKGROUND OF THE INVENTION

This invention relates to cooling in general and more particularly to an improved cooling arrangement for a flat semiconductor device.

Various types of semiconductor devices, such as disc-cell thyristors, generate large amounts of heat energy, when operating at high power levels. To avoid breakdown of the device this heat must be removed. In addition the device cannot be operated at a power level which generates more heat energy than can be removed by whatever type of heat removal device is used with the semiconductor. The most prevalent means for removing heat from such devices is through the use of a heat sink in contact with the semiconductor device. This type of heat sink will generally be of copper or aluminum construction and will comprise a base with fins extending from its back side, the base being in close thermal contact with the semiconductor. Heat is conducted from the semiconductor to the heat ink and is radiated by the fins which are cooled by air. To aid in cooling the fins a blower is often employed. In cooling disc-cell thyristors, it is common to use a pair of heat sinks, placing a heat sink on each side of the thyristor to increase the amount of heat transferred, Because air is a poor conductor, and because the ambient air near the heat sink will tend to be warm, a great many fins and a correspondingly large base to conduct heat thereto are required to dissipate large amounts of heat. This results in heat sinks which are very large and heavy. Typically a pair of heat sinks for use with a thyristor will weigh 10 pounds if made of copper or 7 pounds if made of aluminum. Even with heat sinks of this size the tyristor may not be operated at maximum power. Heat sinks of this size take up large amounts of space, are heavy and are costly. In certain applications, such as in moving vehicles, where large number of high-powered semiconductors are used these disadvantages become particularly important.

There is a type of device, known in the art as a heat pipe, which has been demonstrated to be a very efficient cooling device. The heat pipe is disclosed in U.S. Pat. No. 2,350,348 and in the journal *Chemie-Engenieur-Technik*, vol. 39 No. 1 pp 21 to 26 (1967). Basicially a heat pipe comprises an elongated enclosure, such as a tube, closed on both ends, and having its inner surface covered with a capillary wick. The enclosure is evacuated and the wick saturated with a working fluid such as Freon, methanol, ethanol, acetone, benzene, or water for example. The working fluid is chosen so that it will change from a liquid to a gas at the working temperature of the device to be cooled. One end of the pipe is heated causing the fluid in the wick to evaporate and move to the other end. At the other end means are provided to cool the pipe condensing the vapor. The vapor then returns to the heated end by capillary action. With proper design the capillary flow will even work against the force of gravity. The heat pipe can transmit amounts of heat greatly in excess of solid conductors of the same size.

SUMMARY OF THE INVENTION

The apparatus of the present invention solves the problems associated with the prior art heat sinks with an arrangement which includes a plurality of heat pipes. The device to be cooled is clamped between two solid base members of a conductive metal each of which contains holes for the insertion of heat pipes. Heat pipes are inserted in the holes in good thermal contact therewith and provided with cooling fins on their ends extending out from the holes. Because the cooling fins do not need to be in close proximity to the device the base portion will be smaller and a larger number of lighter fins may be used mounted to a lightweight heat pipe thereby reducing overall weight and the size of heat sink at the semiconductor. With the light weight heat pipe and fins replacing the heavy fins of the prior art, weight of the cooling arrangement can be reduced by a factor of five.The heat pipes may be made as long as required without the need to worry about space and weight requirements at the semiconductor location. The use of the heat pipe also permits placing the cooling end of the heat pipe in a much cooler environment than is found close to the heat generating semiconductor. In one embodiment shown, the cooling fins are placed outside the wall of a vehicle to take advantage of the air flow resulting from vehicle motion. In addition, larger amounts of heat may be removed and the device may be operated at a correspondingly higher power. This permits a less expensive semiconductor device to be used where formerly a more costly device with a higher power rating was used.

DETAILED DESCRIPTION OF THE PREFERRED EMBODIMENT

Figure 1:
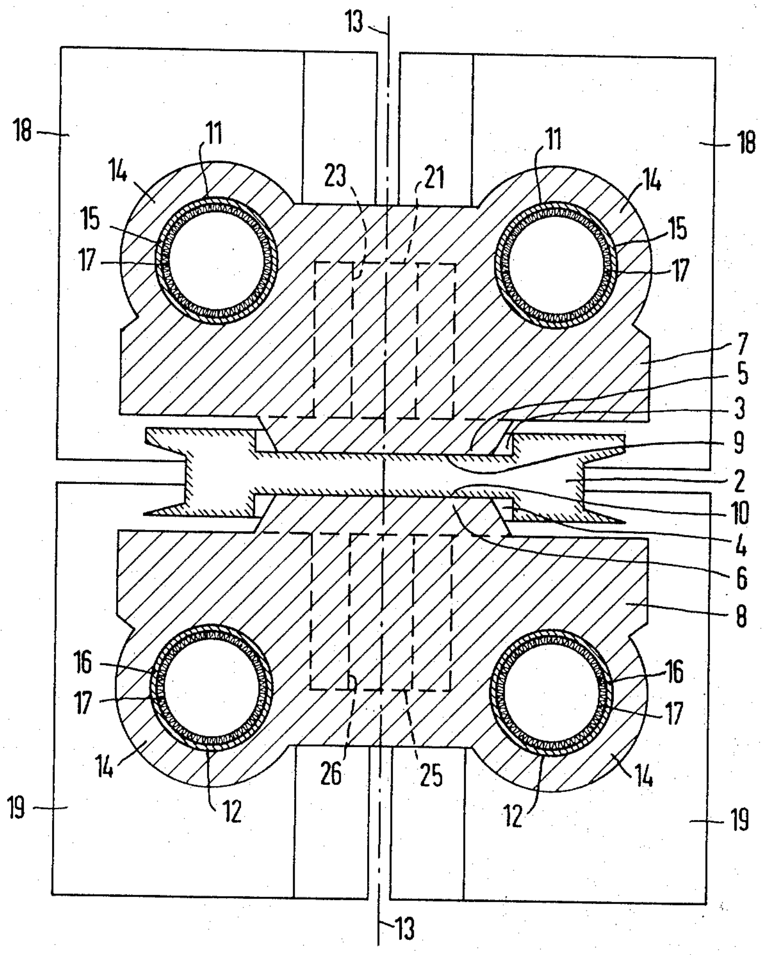
FIG. 1 is a cross sectional view of the preferred cooling apparatus of the present invention.
Figure 2:
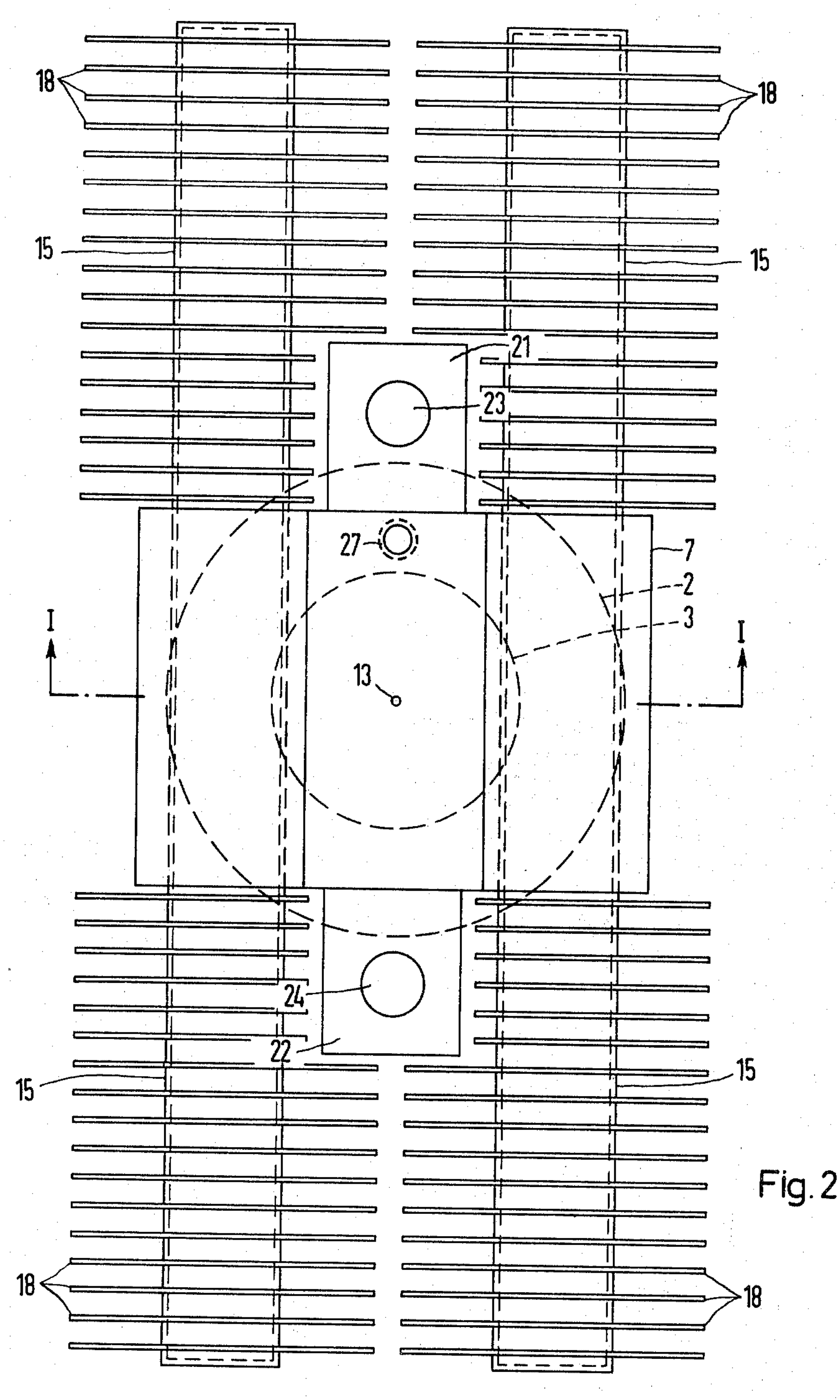
FIG. 2 is a plan view of the apparatus of FIG. 1.

A first embodiment of the cooling apparatus is illustrated in FIGS. 1 and 2. A semiconductor, for example conventional disc-cell thyristor 2, having depressions 3 and 4 on its top and bottom sides, respectively is held tightly between two heat sink base members 7 and 8 by means to be described below. Each of base members 7 and 8 contains a conical projection, 5 or 6 which fits in the depressions 3 and 4 respectively. The close contact at surfaces 9 and 10 will cause the heat generated by thyristor 2 to be readily transferred to the base members 7 and 8 which will be made of a highly conductive material such as copper or aluminum.

Each of the two base members 7 and 8 is provided with two holes 11 and 12 respectively. These will preferably be horizontal as shown but may be oriented in other directions. For example, they may be made parallel to the contact surfaces 9 and 10. (In the figure these surfaces are also horizontal but may not be so in all cases.) They could also be parallel to the vertical axis 13. As will be seen from the emodiment of FIG. 3, the number or arrangement of the holes is not critical. They should however be formed as close to the surfaces 9 and 10 as is practical. This may in some cases be limited by cooling fin size as will be pointed out below. It should also be noted that the wall 14 need not be continuous i.e. a portion of it may be left open.

Relatively thin walled heat pipes labelled 15 and 16 respectively are inserted through each of the holes 11 and 12 and in a manner which assures good thermal contact. For example, they may be soldered in place, heat shrunk or the heat pipes and holes threaded and the heat pipes then screwed into the holes. Each heat pipe 15 and 16 will be lined on the inside with a wick 17 of capillary structure such as metal gauze which is saturated with one of the working fluids described above. Selection of a fluid may be made based on the operating temperature of the semiconductor and boiling points of the fluids. As shown more clearly by the view in FIG. 2 the heat pipes 15 and 16 will extend out a distance from the base members 7 and 8. A plurality of rectangular cooling fins 18 and 19 of aluminum for example are tightly pushed on to the heat pipes 15 and 16. These cooling fins 18 and 19 are arranged parallel to each other and perpendicular to the axes of their respective heat pipes 15 and 16. To improve heat transfer they may be welded or soldered to the heat pipes 15 and 16. For protection against mechanical damage the four corners of the cooling fins can be held in position by edge guides (not shown) of plastic, for example.

Finned tubes comprising a hollow tube with a plurality of fins such as 18 and 19 are commercially available and may be used to construct heat pipes 15 and 16. First, fins would be removed from one end of the tube, the tube inserted in the hole 11 or 12 and soldered in place, wick 17 would then be inserted, ends placed on the tube, the tube evacuated of air and filled with a working fluid and then sealed. The removed fins 18 and 19 would then be replaced on the end which was inserted through the hole 11 or 12. As illustrated by the figure the holes 11 and 12 are some distance from the surfaces 9 and 10. This comes about since the tubes are spaced to avoid the fins 18 and 19 interfering with each other. It is also possible, in order to get the holes 11 and 12 closer to surfaces 9 and 10 so as to improve heat flow, to interleave the fins 18 and 19. Another solution is to bend the heat pipes 15 and 16 away from each other to provide the needed clearance. As noted above they may extend in any direction and still operate. Bend will not impair operation and may also be used where other interference problems are encountered.

To maintain the tight and close contact between base members 7 and 8 and semiconductor 2, fastening tabs 21 and 22 are provided on opposite sides of the base members. These tabs contain respective holes 23 and 24. Similar tabs 25 and 26 are provided on base member 8 aligned with those of base member 7. Bolts may then be inserted through the holes 23 and 24 each then passing through a hole 26 in base member 8 and secured tightly with nuts at base member 8 to compress the semiconductor 2 between members 7 and 8. Fastening may also be done with a yoke which is secured around the tabs 21 and 22. Electrical connections for the semiconductor are provided via tapped holes in the base members 7 and 8 such as hole 27 on base member 7 shown on FIG. 2.

Figure 3:
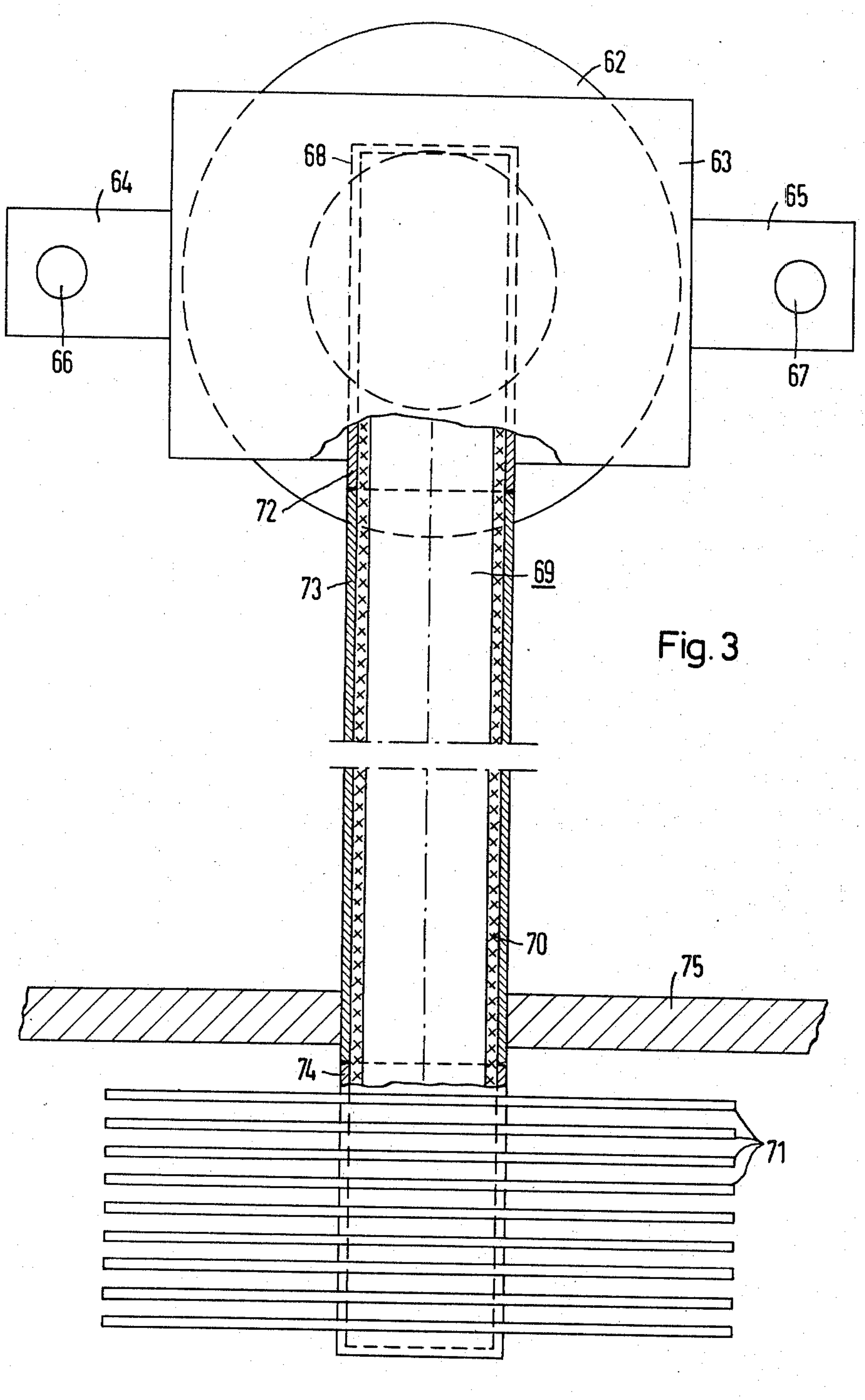
FIG. 3 is a plan view, partially in cross-section of a second embodiment of the apparatus of the present invention.

An alternate embodiment is shown in FIG. 3. As in the embodiment of FIGS. 1 and 2, the semiconductor 62 is held between two conductive base members 63 by bolts (not shown) through the holes 66 and 67 in the tabs 64 and 65 on the base member. In this embodiment each of the two base members 63 will have a single horizontal hole 68 into which is inserted a heat pipe 69 having a capillary wick 70 saturated with working fluid as described above. In this case the heat pipe only extends from the base member 63 in one direction. As before the heat pipe 69 is inserted so as to provide good thermal contact.

The heat pipe extends for a distance to a partition 75 which may for example be the outer wall of a vehicle. On the other side of the wall are placed cooling fins 71 attached in the manner described above. This embodiment permits locating the cooling portion of the heat pipe remote from the semiconductor 63 to make use of better cooling conditions. For example if partition 75 is the wall of a vehicle, the fins 71 will be cooled by the air stream resulting when the vehicle moves.

A further refinement results when the heat pipe is made of three sections 72, 73 and 74. The sections 72 and 74 are of a highly conductive material such as copper and section 73 of a material which is not as good a conductor. In this way there will be good heating at section 72 and good cooling at section 74 but there will be less tendency for heat to escape from the middle section 73. The section 73 may be as long as required and may be straight or curved as the application dictates. This embodiment may also be used where it is not practical to have the cooling fins close to the semiconductor due to mechanical interference with other components. Even though the fins will be in the same general space and not have the advantage of a better cooling environment, they will be moved out of the way of other components.

Thus an improved cooling apparatus for a flat semiconductor which is lighter, cheaper and permits disposing of heat at a remote location has been shown. Although specific embodiments have been shown and described it will be obvious to those skilled in the art that various modifications may be made without departing from the spirit of the invention which is intended to be limited solely by the appended claims.

What is claimed is:

1. Apparatus for cooling a flat semiconductor device comprising:

a. a pair of base members made of a material with high thermal conductivity, each having a surface which is held in close mechanical contact with the flat surfaces of the semiconductor on opposite sides thereof, and each of said base members having at least one hole therein; and b. a plurality of heat pipes, one being provided for each hole in said base members, each comprising an elongated closed chamber lined on the inside with a wick material saturated with a working fluid, said closed chamber being made up of three sections, a first, inner section of highly conductive material a second, middle section of a material of low conductivity and a third outer section of highly conductive material, each having said first section inserted in and in close thermal contact with a hole in said base members and each of said closed chambers having mounted on said third outer sections, transverse to the heat pipe axis and in a manner such as to maintain good thermal contact, a plurality of cooling fins.

2. The invention according to claim 1 wherein said holes in said base members do not extend through the base member and each of said heat pipes projcts out from their respective base member in only one direction.

3. The invention according to claim 1 wherein said holes in said base members extend through the base members and said heat pipes pass through said holes and extend out from said base member in two directions and wherein both projecting ends of each heat pipe have a plurality of cooling fins mounted thereon.

4. The invention according to claim 1 wherein said holes are horizontal.

5. The invention according to claim 1 wherein each of said heat pipes is soldered into its respective hole.

6. The invention according to claim 1 wherein said holes are bored parallel to the contacting surfaces of said base members and said semiconductor.

7. The invention according to claim 1 wherein said base members are made of copper.

8. The invention according to claim 1 wherein said base members are made of aluminum.

9. The invention according to claim 1 wherein said cooling fins are made of aluminum.

10. The invention according to claim 1 wherein at least one of said heat pipes is passed through a partition with said base members on one side of said partition and the outermost portion of said one heat pipe having cooling fins thereon on the other side.

* * * * *

UNITED STATES PATENT OFFICE
CERTIFICATE OF CORRECTION

Patent No. 3,792,318 Dated February 12, 1974

Inventor(s) Paul Fries, Konrad Moritz

It is certified that error appears in the above-identified patent and that said Letters Patent are hereby corrected as shown below:

In the Foreign Application Priority Data change the file number of the German application upon which the claim for priority is based from "2204589" to --P 22 04 589.2--

In column 1, line 23, change "ink" to --sink--

In column 1, line 37, change "tyristor" to --thyristor--

In column 4, line 66 (claim 2), change "projcts" to --projects--

Signed and sealed this 9th day of July 1974.

(SEAL)
Attest:

McCOY M. GIBSON, JR.
Attesting Officer

C. MARSHALL DANN
Commissioner of Patents